United States Patent [19]

Hemming

[11] Patent Number: 4,733,013
[45] Date of Patent: Mar. 22, 1988

[54] SHIELD SYSTEM AND SANDWICH SEAM FOR ATTENUATION OF ELECTROMAGNETIC ENERGY

[75] Inventor: Leland H. Hemming, Poway, Calif.

[73] Assignee: Aluminum Company of America, Pittsburgh, Pa.

[21] Appl. No.: 921,707

[22] Filed: Oct. 22, 1986

[51] Int. Cl.4 .............................................. H05K 9/00
[52] U.S. Cl. .............................................. 174/35 MS
[58] Field of Search .......... 174/35 MS, 35 R, 35 GC; 361/424

[56] References Cited

U.S. PATENT DOCUMENTS

| 2,838,592 | 6/1958 | Feketics | 174/35 MS |
| 3,147,336 | 9/1964 | Mathews | 174/35 MS |
| 3,153,692 | 10/1964 | Lindgren | 174/35 |
| 3,432,609 | 3/1969 | Duvall et al. | 174/35 |
| 3,745,226 | 7/1973 | Nichols et al. | 174/35 MS |
| 3,783,174 | 1/1974 | Lindgren | 174/35 |
| 3,790,696 | 2/1974 | Lindgren | 174/35 |
| 3,885,084 | 5/1975 | Kaiserswerth et al. | 174/35 |
| 4,507,520 | 3/1985 | Lindgren | 174/35 |

Primary Examiner—A. T. Grimley
Assistant Examiner—David A. Tone
Attorney, Agent, or Firm—Elroy Strickland

[57] ABSTRACT

A structure for attenuating the passage of electromagnetic energy includes at least two panels made of electromagnetic energy attenuating material having adjacent edges thereof disposed in near abutment to form at least a portion of an enclosure. Electromagnetic energy attenuating strips are disposed astraddle and lengthwise of the adjacent edges of the panels on opposed faces thereof, with the strips being in intimate, face-to-face contact with the panels. Fastening means are employed to connect and compress strips and panels together in a sandwich seam and in a manner that doubles the length of travel for any radiated energy attempting to travel between the strips and panels. The attenuation effected by the seam is enhanced by placing a thin layer or coating of lossy material between at least one of the strips and abutting panels.

23 Claims, 10 Drawing Figures

SHIELD SYSTEM AND SANDWICH SEAM FOR ATTENUATION OF ELECTROMAGNETIC ENERGY

BACKGROUND OF THE INVENTION

The present invention relates generally to structures for shielding against the penetration of radiated electromagnetic energy, and particularly to a joint structure and compression seam that is effective in minimizing leakage of electromagnetic energy at radio frequencies throughout the full frequency spectrum.

Classified information processing is generally performed on digital electronic equipment, such as computers and digitally controlled instrumentation. These devices transfer data between main frame units and input and output devices such as keyboard terminals and printers. Because of such transfer of data and information, there is a risk of disclosure because of the availability of sophisticated electronic surveillance devices. The effectiveness of these devices has increased dramatically in recent years. To meet such sophistication, one proposal has involved the placing of each piece of equipment in a shielded enclosure. However, with multiple pieces of equipment, the cost can be prohibitive if such a procedure is used.

BRIEF SUMMARY OF THE INVENTION

Typical digital data processing equipment produces detectable, radio frequency signals that are confined to frequencies less than 1 GHz. It is, therefore, highly desirable that a cost-effective shielding system be provided to prevent substantial escape of such signals particularly from large enclosed areas containing the equipment. In the present invention, this is accomplished by using the principle of a waveguide below cutoff. For economic reasons, cutoff is chosen to occur at about 400 MHz, which is consistent with detectable emissions from both mainframe and personal computers. Below this frequency, shielding effectiveness exceeds 100 dB, which is a common specification for shielded enclosures, e.g., MIL-STD-285 ("Military Standard, Attenuation Measurements for Enclosures, Electromagnetic Shielding and Electronic Test Purposes, Method of", Department of Defense, dated June 25, 1956) and NSA 65-6 ("National Security Agency Specification for R. F. Shielded Enclosures for Communications Equipment; General Specification", dated Oct. 30, 1964.

The present invention provides such a system using a single layer of metal panels installed on all six surfaces of a room or enclosure to be shielded. The edges of adjacent panels are placed in substantial or near abutment and a sandwich joint is formed by placing metal strips astraddle and along the adjacent edges on both faces of the adjacent panels. This hides the strip of the sandwich that is located against the room surfaces, as it will be covered by adjacent panels and the second strip, the second strip will therefore be exposed. A row of metal fasteners on each side of the adjacent edges of the panels extends through the strips and panels to secure the same in intimate face-to-face contact. Preferably, the exposed strip of the sandwich is more rigid than the hidden strip and panels to pull the less rigid strip and panels into a flat, intimate and homogeneous sandwich that has substantially no waviness or bowing that might otherwise provide openings or gaps through which radiated energy might travel.

To make the above sandwich and seam at locations removed from room corners, right angle corner members are provided, though abutting panel members in the corners of a room can be lapped with right angle metal strips located on both sides of the abutting members.

The attenuation of electromagnetic energy provided by the shield system briefly described above is further enhanced by placing a layer of energy-absorbing lossy material between at least one of the metal strips and the abutting panels at the location of each seam.

Further, for those rooms and enclosures that are paneled with wallboard or plaster, the present invention includes the use of wood strips applied to the walls, ceiling and floor of the enclosure before the metal panels and strips are installed. Or, plywood panels can be placed on the walls of the enclosure. The wood strips or plywood panels are attached to the studding behind the wallboard or plaster, and the metal panels and strips then attached to the wood strips or plywood. The wood provides both a smooth surface for the metal panels and strips and a lasting installation of the metal panels and strips, as the wood is secured to studding.

The shield system of the invention can be used on the inside or outside wall surfaces of an enclosure or building.

THE DRAWINGS

The invention, along with its advantages and objectives, will be best understood from consideration of the following detailed description and the accompanying drawings in which.

Figure 6:
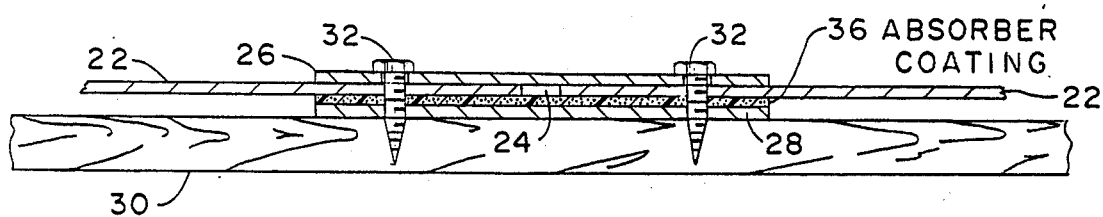
Figure 7:
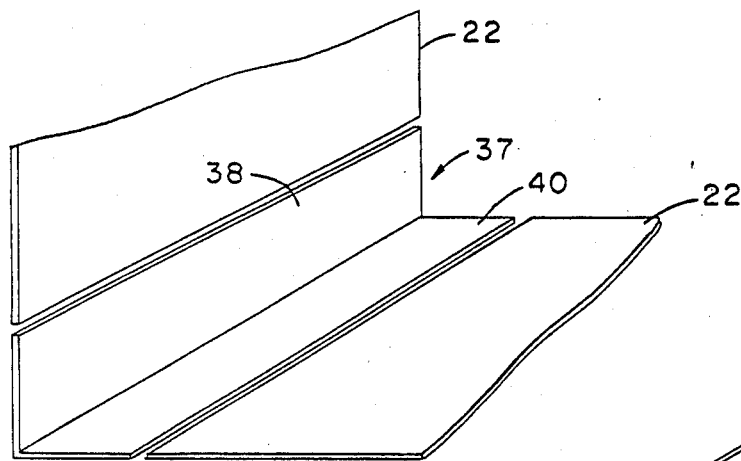
Figure 8:
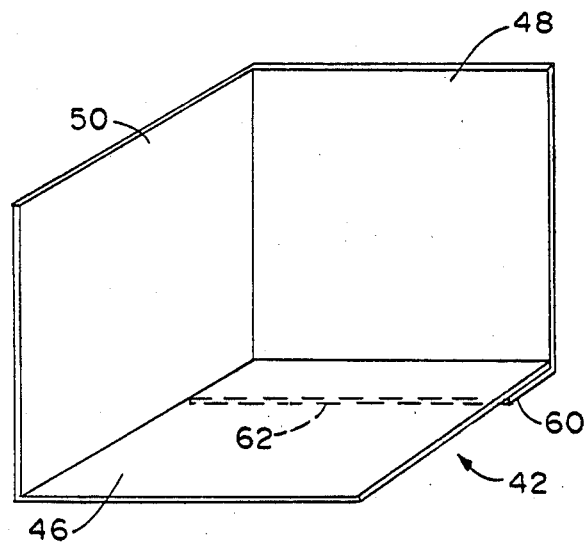
Figure 9:
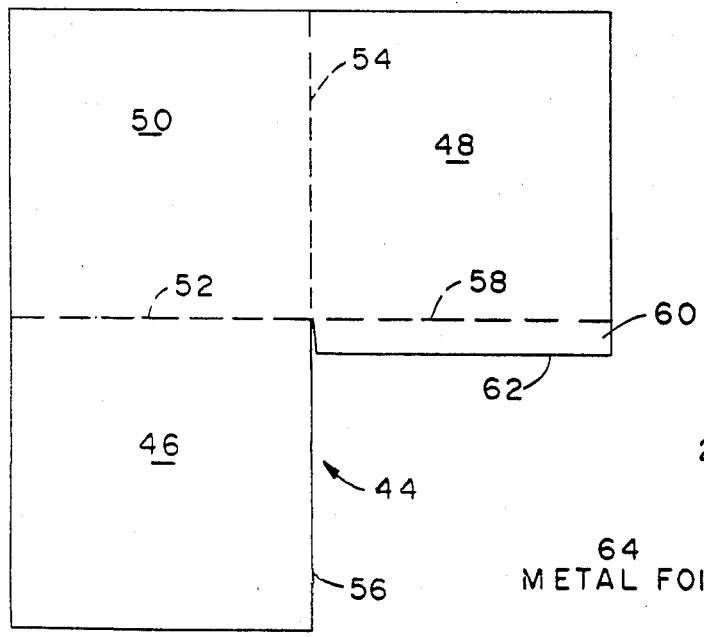
Figure 10:
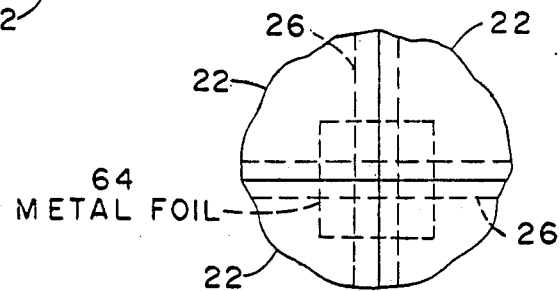

FIG. 6. is a partial sectional view of the second embodiment of the invention;

FIG. 7. is a perspective view of a right angle member for connecting panels at the corners between two walls and between a wall and a floor or ceiling;

FIG. 8 is a perspective view of a member for connecting panels at the corners formed by three intersecting surfaces of a room;

FIG. 9 is a plan view of a flat piece of metal for forming the corner member of FIG. 9: and FIG. 10 is a partial plan view of a butt joint between four metal panels and strips of the invention.

PREFERRED EMBODIMENT OF THE INVENTION

Figure 1:
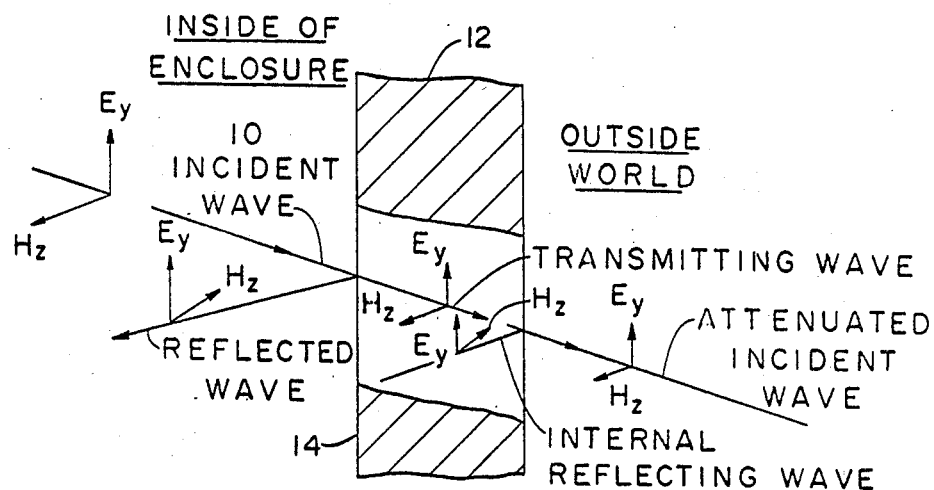
FIG. 1 is a diagrammatic representation of a plane wave of radiated radio frequency energy directed against a wall structure to explain shielding phenomena.

Referring now to FIG. 1 of the drawings, an incident or plane wave 10 of high frequency (greater than one MHz) electromagnetic, radio frequency energy is shown directed against a wall structure 12. The electric and magnetic components of the wave are indicated by vectors Ey and Hz, respectively. As shown, the wave is intercepted by the wall at its interface 14 with the open area adjacent the wall surface such that a portion of the wave is reflected into the area. However, not all the energy of the wave is reflected such that a portion thereof is transmitted through the finite thickness of wall 12. The amplitudes (magnitudes) of the original wave 10 and the portion reflected at interface 14 depend upon the surface impedance of the material of barrier 12 with respect to impedance of the wave.

The wave transversing the thickness of barrier 12 experiences absorption and, at interface 16 between the barrier surface and the open area on the far side of the barrier reflection of the wave occurs again. This second reflection contributes an insignificant loss in the removal of the radiated energy and is usually neglected. In any case, the transmitted portion of the energy is the amount thereof that traverses the first interface 14 less the energy absorbed in transversing the barrier and that reflected at the second interface 16.

With plane wave conditions, the shielding effectiveness (SE) of a barrier is computed by first computing each of the contributing factors discussed above and then summing the contributions as follows:

$$SE_{dB} = R_{dB} + A_{dB} + B_{dB} \quad (1)$$

where $R_{dB}$ = reflection loss in decibels at the first interface,
$A_{dB}$ = transmission or absorption loss in decibels, and
$B_{dB}$ = internal reflection loss at the exiting interface in decibels (usually neglected).

The effectiveness of a shield to electric and electromagnetic fields may also be measured in terms of the fraction of the impinging field which exits the far side of the barrier:

$$SE = 20 \log E_2/E_1 \quad (2)$$

where $E_1$ = impinging field intensity in terms of volts per meter (V/m),
$E_2$ = exiting field intensity in V/m.

The interface between mating members of a shield is of primary significance in shielding effectiveness. It is here that the continuity and conductivity of the interface must be high and the permeability to radio frequency energy must be low. A physically discontinuous interface and inhomogeneous bond between shielding surfaces can result when connecting adjacent members together. If bowing or waviness occurs between the connected members, gaps may be formed through which radio frequency energy can penetrate at frequencies approaching 0.1 wavelength, i.e., such gaps function as waveguides that are capable of propagating the energy therethrough. The attenuation A in decibels (dB) of the energy follows the criteria of a waveguide-beyond-cutoff, described mathematically as follows:

$$A = 0.0046 L F_o [(F_c/F_o)^2 - 1] dB \quad (3)$$

where

L = gap length in inches for overlapping members or the thickness of the shielding material for abutting members;
$F_o$ = operating frequency of the guide (gap) in MHz;
$F_c$ = cutoff frequency of the guide (gap) in MHz = 5900/g for a rectangular gap or 6920/g for a circular gap.
g is the largest transverse dimension of the gap in inches.

Figure 2:
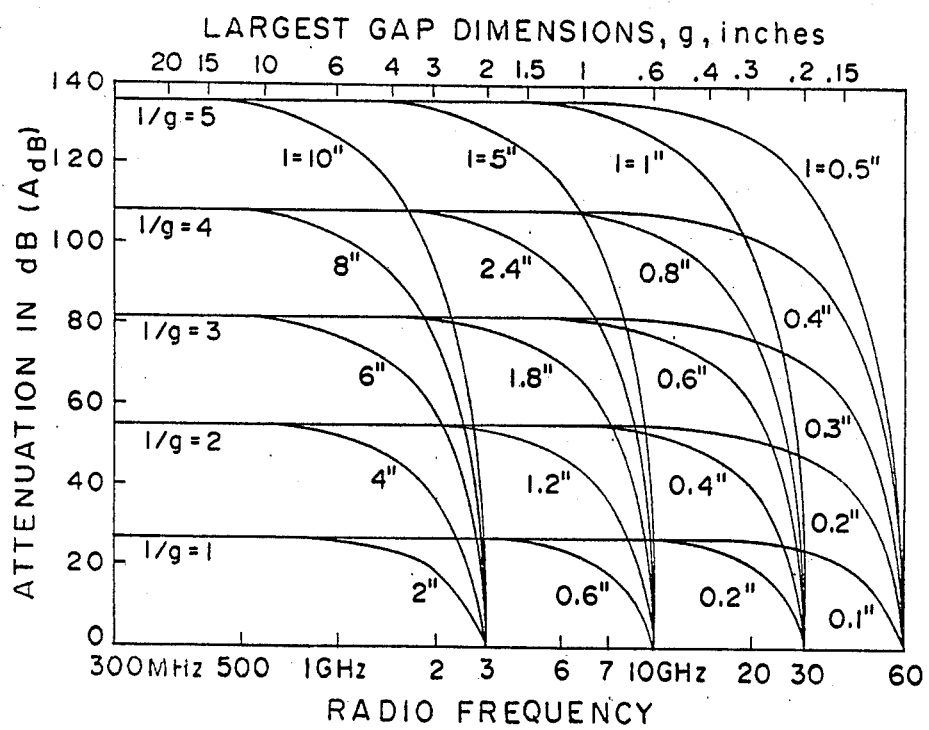
FIG. 2 is a graph relating the attenuation of radio frequency energy to gap dimensions in a shield structure.

This equation is plotted in FIG. 2 of the drawings for a plurality of rectangular gaps. The largest transverse dimensions (g) of the gaps are listed on the uppermost horizontal axis of the graph. The lengths (L) of gaps, through which the energy travels in penetrating the gap, are shown immediately adjacent curves that represent the relationship of the attenuation of energy as a function of the frequencies of the energy listed along the ordinate. The logarithmic relationship (equation 2) between impinging and exiting fields compresses the curves such that each decibel increase in attenuation is an order of magnitude. For example, a gap length of two inches capable of propagating three GHz of microwave energy provides about 25 dB of attenuation of the energy if the frequency of the energy is decreased to about 800 MHz. This phenomenon is known as "low pass cutoff"; the longer the length of the wave guide, the greater the attenuation, particularly as one changes the frequency in a direction that "cuts off" its ability to be propagated.

A reliable joint structure should provide attenuation greater than 100 dB at frequencies of 400 MHz and less. A double overlap sandwich 20, as shown in FIGS. 3 and 4 of the drawings, has been found to provide such attenuation.

Figure 3:
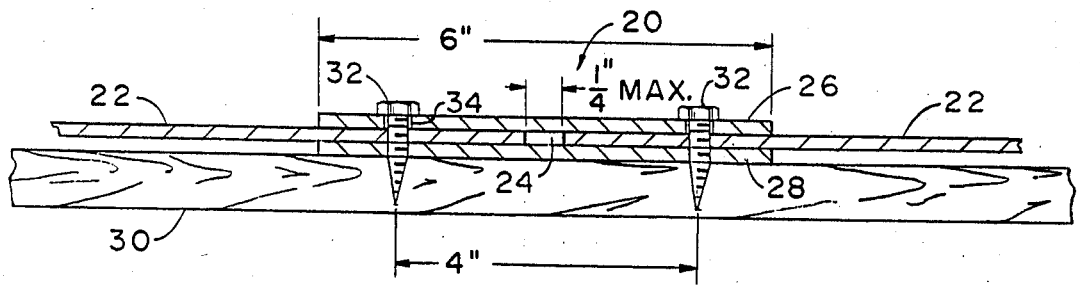
FIG. 3 is a partial sectional view of two adjacent panels of the shield of the invention and a sandwich seam effected between the panels.
Figure 4:
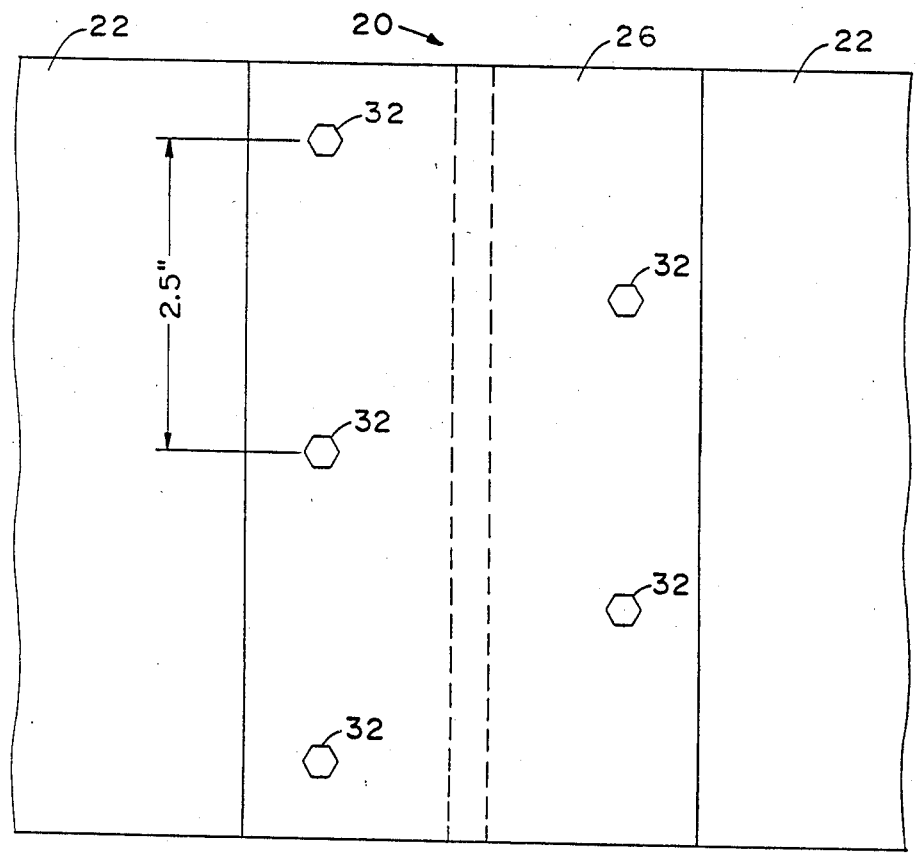
FIG. 4 is a plan view of the structure of FIG. 3.

Referring to FIG. 3, sandwich structure 20 includes two metal panels 22 having their edges disposed in near abutment between two metal strips 26 and 28. The edges of the panels are placed on the substantial center of the metal strips, which strips extend lengthwise of the panel edges in face-to-face contact with the panels. The sandwich is shown secured together and to a wooden sheet or strip 30 by metal screws 32.

As best seen in FIG. 3, there is no overlapping of adjacent panels 22, but it would be desirable to have the edges of the adjacent panels disposed in abutting contact to help assure a continuous electrical path between panels. However, abutting contact of the edges can cause buckling of the panels when they expand and contract with changes in temperature. And, buckling of the panels may disturb the electrical continuity of the interfaces of the sandwich of the strips and panels. The panels are, therefore, installed with a small, i.e., no more than one quarter of an inch, space 24, between the edges of the panels.

Fastener means other than metal screws can be employed to join the components together, but screws are preferred because of the ability to control the torque of screws in the fastening process. As indicated earlier, the integrity of the interface between the components of the sandwich is the key to an effective shield such that any fastener that does not secure the components in proper compression may create a narrow channel (waveguide) between the locations of the fasteners, capable of conducting signals therethrough. With proper metal screws and proper torquing, good compression of the sandwich is effected.

Preferably, screws 32 are self-tapping and are a high grade, i.e., high strength, cadmium coated steel screw having a flat face for contacting the planar outer surface of exposed strip 26. The high strength of the screw allows proper torquing, while the flat face insures broad maximum contact between the screw and strip to effect broad maximum compression of the components of the sandwich. An exception to the flat screw might be made for the floor since it would be desirable to have the heads of the screws flush with the surface of the floor. This would require countersinking holes 34 (FIG. 3) provided in the exposed strip to accommodate screws having a head with a beveled surface for the countersink, and a flat outer surface.

Exposed strip 26 is preferably prepunched to provide starting holes 34 for screws 32. Each screw being self-tapping penetrates the panels beneath strip 26 and penetrates hidden strip 28 as the screw is rotated through hole 34. Burrs tend to be created in the metal of the panels and hidden strip 28 as the screws tap their way through the metal. The burrs, in turn, fill the holes created by the screws with metal such that good metal-to-metal contact is made between the screws, the panels and the hidden strip to provide a continuous electrical path between them.

As seen in FIG. 4 of the drawings, screws 32 are located in two rows that extend along and adjacent the edges of the strips and panels. Preferably, the screws are staggered such that any electromagnetic energy that might enter the sandwich between one strip and a panel must travel the distance of one-half of the strip width to space 24, and then, travel in the opposite direction between the panel and the other strip. This allows the use of a relatively narrow strip, as the length of travel of the energy is doubled, keeping in mind that the longer the length of a waveguide, the greater the attenuation of the energy traveling therethrough.

The sandwich structure of the invention was tested in a construction using six-inch wide galvanized steel strips 26, 28 and galvanized steel panels 22. In this test, panels 22 and hidden strip 28 were 0.0217 inch thick (twenty-six gauge), and the exposed strip was 0.0276 inch thick (twenty-four gauge), thereby making it the more rigid member. It is believed that use of an exposed strip that is more rigid than the hidden strip and panels will minimize gaps in the seam. The rigid strip 26 provides a cost-effective means to flatten the less rigid panels and strips 28 against the planar surface of wall or wood strips 30 to create flat, continuous face-to-face contact between the metal strips and panels when the screws 32 are threaded through the metal strips and panels and into wooden strips 30. The flattening effect of the rigid strip and wall surface creates a joint structure that is substantially free of buckles and open spaces that might allow passage of electromagnetic energy. The thickness and/or material of the inner and outer strips and of the panels can, of course, be chosen to provide a rigidity sufficient in each member to prevent or at least substantially limit any waviness or buckling.

Figure 5:
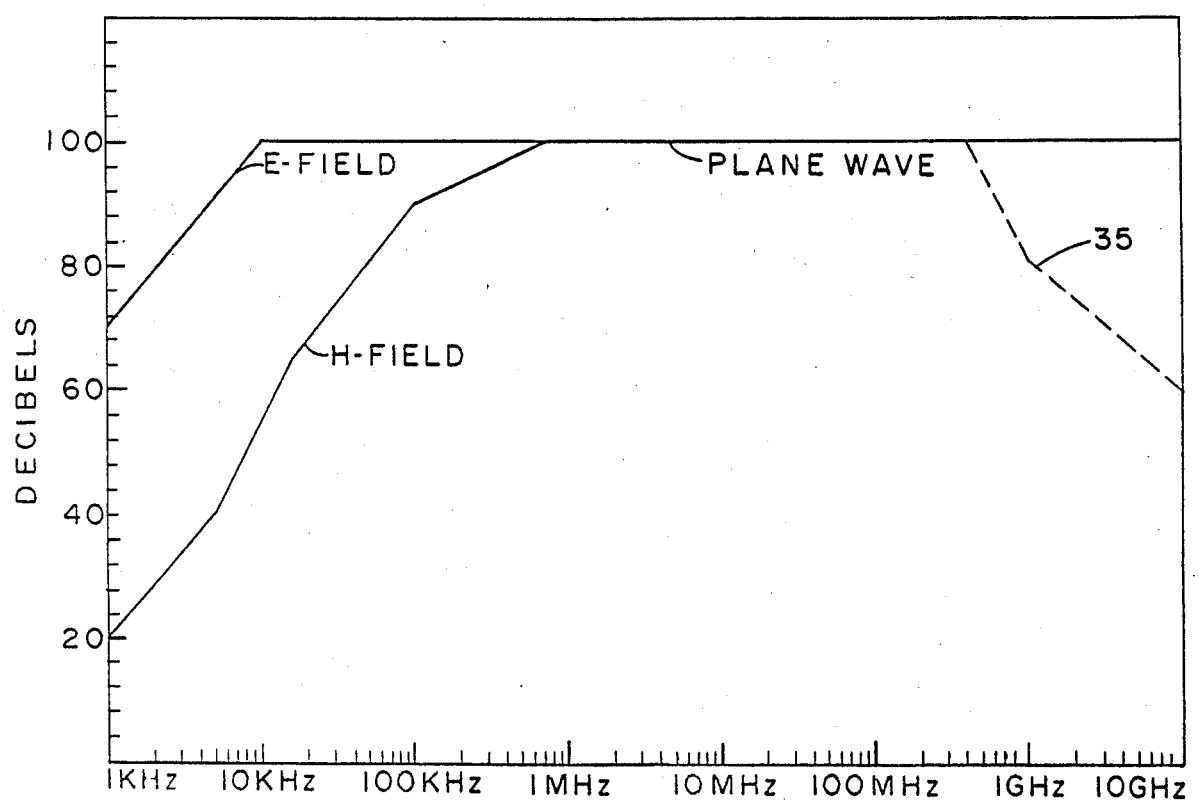
FIG. 5 is a graph showing minimum standards of attenuation required by the Department of Defense and the National Security Agency (NSA)

The sandwich seam of the invention, as described above, provided attenuation in excess of 100 dB of the incident wave of radio frequency energy and its electric field component at frequencies of 400 MHz and less. The magnetic field component Hz of the energy was blocked by the ferrous material of the steel panels and strips. The ferrous material acts as a closed path and circuit through which magnetic lines of force are conducted. FIG. 5 of the drawings shows the attenuation characteristics of the three electrical parameters, as represented by three solid lines. Dash line 35 in FIG. 5 shows the effectiveness of the sandwich seam falling off as 1 GHz and beyond is approached.

As shown in FIG. 4, using six-inch wide strips 26 and 28, a suitable distance between screws 32 lengthwise of the sandwich was found to be 2½ inches. The screws were located about one inch inwardly of the edges of the strips, as shown in FIG. 3.

The shielding effectiveness of sandwich seam 20 is enhanced by the addition of a material that will absorb wave energy by converting it to heat energy. Several materials exhibit such lossy, microwave absorption properties, powdered iron being one of the best. The powdered iron can be contained in Neoprene rubber compound, for example. FIG. 6 of the drawings depicts an embodiment of the invention employing such a material. As shown, a layer or coating 36 of energy absorbing material is located between hidden strip 28 and panels 22. A minimum thickness for 36 can be on the order of 0.020 inch to provide a 100 dB shielding effectiveness through a frequency of 10 GHz. This offsets the "roll off" in effectiveness as shown in FIG. 5, i.e., shielding effectiveness improves as the frequency increases.

FIG. 7 of the drawings shows a two-sided corner member 37 of the system for attaching metal panels 22 together at the corners formed between two room walls or between a wall and ceiling or floor of a room. The purpose of such a member is to permit ease of assembly of the sandwich structure of the invention at the locations of two-sided corners of a room. It can be appreciated that it is more difficult to work in a corner than on an exposed planer surface of a wall.

Corner member 37 can be made by simply taking a flat sheet of metal and bending the same to provide two side or panel portions 38 and 40 of equal distance from the apex of the corner, and at right angles to each other.

As shown in FIG. 7, the length of corner member 37 matches that of the width of panels 22, the panels being shown in phantom. If the panels are square, only one length is needed for all corner members 37. If the panels are not square, then the corner members will have different lengths, i.e., lengths that match both the width and length of the panels.

FIG. 8 shows a three-sided corner member 42 that, again, allows the joining of panels 22 at locations removed from the corners of a room that are formed by three intersecting wall, ceiling or floor surfaces. Member 42 can be constructed from a flat piece 44 (FIG. 9) of metal having two leg or wall portions 46 and 48 extending in directions perpendicular to each other. The size of portions 46 and 48 are the same as a wall portion 50 located in the corner intermediate 46 and 48.

Wall portions 46 and 48 are folded at the locations of dash lines 52 and 54, in FIG. 9, in a manner that places the folded portions in right angle relationship to portion 50 to form the structure of FIG. 8. The corner member now has three wall portions of equal size and at right angles to each other but with two edges 56 and 58 (FIG. 9) unconnected. These edges are connected together preferably by an integral lip portion 60, shown in FIG. 9 as a continuation edge 58 and wall portion 48, that is folded over the other wall portion 46, as shown in FIG. 8. The edge of lip 60 (i.e., dash line 62 in FIG. 6) is then soldered or welded to the other wall portion. In this manner, the joint effected between the lip and wall portion is better assured of being an effective shield against the leakage of electromagnetic energy.

The length of each side or wall portion of corner members 37 and 42, in measuring from the apex of the right angle to the other edge of each panel portion, is the same. And, like the panels and strips, the corner members are preferably galvanized steel.

Generally, the ceilings and walls of most rooms are covered with wallboard or plaster, in which case, such structures do not provide an adequate means for securing the panels and strips of the invention to ceilings and walls. With such wall and ceiling materials, the ceiling and walls of a room are preferably first covered with wooden strips 30 (FIG. 3) with the strips being suitably attached to the studding of the room. The floor of the room may also be inadequate for installing the subject system, in which case a plywood covering can be installed on the floor. If, however, a room already has a suitable wood covering, then the need to install wooden strips is obviated.

In either case, before the metal panels and strips are installed, it is preferable to provide a visible grid on the wall, ceiling and floor surfaces to properly locate the sandwich seams 20 of the invention. The lines of the grid should begin at the corners of all six room surfaces so that the seams involving corner members 36 and 38 will be properly located. The actual number of seams will be determined by the size of the enclosure and the outside dimensions of the panels. Wooden strips 30, suitably attached to the walls and ceiling, can provide such a grid. On the floor, visible lines can be drawn, as wooden strips would not provide a continuous surface to support panels 22.

Next, metal strips 28 are placed on the walls, ceiling and floor at the locations of the grid lines or wood strips. Patches or strips of film adhesive can be placed on the backs of the metal strips for this purpose, which metal strips are then pressed into place on the wood surfaces.

Preformed corner members 37 and 42 are now installed in and along all corner areas of the room, again using adhesive material placed on the rear surfaces of the corner members. The edges of the corner members will lie on the substantial center of metal strips 28 and wooden strips 30.

The metal panels 22 are now installed, with the edges of adjacent panels and corner members being disposed adjacent the centers of strips 28 that have been placed on the wall surfaces, i.e., on the wooden strips.

In laying out the grid and in paneling a room with the system of the invention, there will be occasions when more than two adjacent panels 22 intersect and abut each other in the form of a T or cross, a cross intersection being depicted in FIG. 10 of the drawings. In such a case, a foil shim 64 is placed astraddle the intersection and in contact with the adjacent panels, as shown in dash outline in FIG. 10, to prevent escape of wave energy through the intersection. The material of the shim is preferably copper or brass and the thickness thereof can be one to two mils. Preferably, the shim is located under exposed strip 26.

Exposed metal strips 26 are now placed over the edges of the panels and corner members, and any shims 65, and centered thereon such that the holes 34 in the exposed strips will be located inwardly from the edges of panels and hidden strips. With the holes so located, metal screws 32 can now be threaded through the holes and into and through the metal of the panels and hidden strip, and then into wood strips 30 to secure and compress the panels and metal strips, and any shims, together as shown in FIG. 3.

While the invention has been described in terms of preferred embodiments, the claims appended hereto are intended to encompass all embodiments which fall within the spirit of the invention.

What is claimed is:

1. A structure for attenuating the passage of electromagnetic energy comprising at least two panels made of electromagnetic energy-attenuating material having adjacent edges thereof disposed in substantially abutting relationship to form at least a portion of an enclosure, electromagnetic energy-attenuating strips disposed astraddle and lengthwise of the adjacent edges of said panels on opposing faces thereof with substantially no non-energy-absorbing material therebetween, and two rows of relatively closely spaced screws connecting said strips and panels together in a sandwich seam that substantially resists passage of electromagnetic energy.

2. The structure of claim 1 in which the screws in each row are spaced apart no further than about two and one-half inches and are located about two inches inwardly from the edges of the abutting panels.

3. The structure of claim 1 in which a layer of lossy material is located between at least one of the metal strips and abutting panels.

4. The structure of claim 3 in which the lossy material is powdered iron.

5. A structure for attenuating the passage of electromagnetic energy comprising at least two panels made of electromagnetic energy-attenuating material having adjacent edges thereof disposed in substantially abutting relationship to form at least a portion of an enclosure, electromagnetic energy-attenuating strips disposed astraddle and lengthwise of the adjacent edges of said panels on opposing faces thereof with the strips being in intimate, face-to-face contact with the panels, and two rows of closely spaced screws connecting said strips and panels together in a sandwich seam which substantially resists passage of electromagnetic energy.

6. The structure of claim 5 in which the screws in each row are spaced apart no further than about two and one-half inches and are located about two inches inwardly from the edges of the abutting panels.

7. The structure of claim 5 in which a layer of lossy material is located between at least one of the metal strips and abutting panels.

8. The structure of claim 7 in which the lossy material is powdered iron.

9. A system for shielding the walls, floor and ceiling of a room against penetration of electromagnetic energy, said system comprising metal panels covering the walls, floor and ceiling of said room, with adjacent edges of the panels disposed in substantially abutting relationship, metal strips straddling the adjacent edges of the panels on opposed faces and lengthwise thereof, fastening means securing the strips and panels together in intimate contact in a sandwich seam to provide attenuation of radiated electromagnetic energy, and a layer of lossy material located between at least one of the strips and the abutting panels.

10. The system of claim 9 in which the panels and at least one of the strips has a thickness on the order of 0.0217 inches.

11. The system of claim 9 in which at least one of the strips has a thickness on the order of 0.0276 inches.

12. The system of claim 9 in which the fastening means comprises screws that are located about two inches from the edges of the panels and are spaced no further than about two and one-half inches apart along the edges of the strips and panels.

13. The system of claim 9 including right angle metal members placed in the room corners to connect together adjacent panels such that joints formed between the right angle members and panels are spaced from the room corners.

14. The system of claim 9 including three-sided, metal members placed in room corners formed by three intersecting wall, ceiling or floor portions of the room.

15. The system of claim 14 in which the three-sided member includes three wall portions located at right angles to each other, with one of the wall portions having an extension that is folded over an adjacent wall portion, and joined to the adjacent wall portion.

16. The system of claim 9 in which more than two adjacent panels form an abutting intersection, the system including a foil metal shim located astraddle the intersection in contact with the panels and metal strips.

17. A method of shielding a room against the penetration of electromagnetic energy through the walls, ceiling and floor of the room, the method comprising
providing electromagnetic energy attenuating panels for covering the walls, ceiling and floor of the room,
placing a first set of electromagnetic energy attenuating strips against the walls, ceiling and floor at the locations of joints to be formed between adjacent edges of said panels,
placing the panels against the walls, ceiling and floor, with the adjacent edges of the panels overlying said first set of strips and in substantially abutting relationship along the approximate centers of the strips,
placing a second set of strips on the panels over the adjacent edges on the opposite face of the panels from said first set of strips,
fastening said panels and strips together in a sandwich seam that is effective to attenuate the passage of electromagnetic energy, and
a layer of lossy material located between at least one of the strips and the abutting panels.

18. The method of claim 17 including the step of providing wood strips on the walls and ceiling at the locations of the joints to be formed between adjacent edges of the panels.

19. The method of claim 17 including the steps of covering the wall, ceiling and floor of the room with wood panels, and placing the electromagnetic energy attenuating panels and strips on the wood panels.

20. The method of claim 19 including the step of providing visible marks on the wood panels at the locations of the joints to be formed between adjacent edges of the panels.

21. The method of claim 17 including the steps of using metal strips having a greater rigidity than that of the panels for the second set of strips, and
directing fasteners through the strips and panels to pull the panels and strips together into intimate, face-to-face relationship.

22. A method of shielding an existing room against the penetration of electromagnetic energy through the walls, ceiling and floor of the room, the method comprising
providing electromagnetic energy attenuating panels for covering the walls, ceiling and floor of the room,
placing a first set of electromagnetic energy attenuating strips against the walls, ceiling and floor at the locations of joints to be formed between adjacent edges of said panels,
placing the panels against the walls, ceiling and floor, with the adjacent edges of the panels overlying said first set of strips and in substantially abutting relationship along the approximate centers of the strips,
placing a second set of strips on the panels over the adjacent edges on the opposite face of the panels from said first set of strips,
fastening said panels and strips together in a sandwich seam that is effective to attenuate the passage of electromagnetic energy, the fastening means extending through the materials of the panels and strips, and
supporting said panels and strips on the wall, ceiling and floor of the room.

23. A system for shielding an existing room against the penetration of electromagnetic energy through the walls, ceiling and floor of the room, the system comprising
a first set of electromagnetic energy attenuating strips disposed against the walls, ceiling and floor of the room at locations of joints to be formed between adjacent edges of electromagnetic energy attenuating panels,
electromagnetic attenuating panels disposed against the strips on the walls, ceiling and floor of the room, with adjacent edges of the panels overlying the strips and disposed in substantially abutting relationship along the approximate centers lengthwise of the strips,
a second set of electromagnetic attenuating strips located on the panels at the locations of the abutting edges and opposite the first set of attenuating strips, and
fastening means extending through the materials of the panels and strips to secure the panels and strips together in a sandwich seam that is effective to attenuate the passage of electromagnetic energy, the panels and strip being supported by the walls, ceiling and floor of the room.

* * * * *